(12) United States Patent
Kim et al.

(10) Patent No.: US 6,992,360 B2
(45) Date of Patent: Jan. 31, 2006

(54) PHOTODETECTOR INTEGRATABLE LIGHT COUPLING APPARATUS

(75) Inventors: In Gyoo Kim, Daejeon-Shi (KR); Gyung Ock Kim, Seoul (KR)

(73) Assignee: Electronics and Telecommunications Research Institute, Daejon-Shi (KR)

( * ) Notice: Subject to any disclaimer, the term of this patent is extended or adjusted under 35 U.S.C. 154(b) by 0 days.

(21) Appl. No.: 10/803,885

(22) Filed: Mar. 19, 2004

(65) Prior Publication Data

US 2005/0116311 A1   Jun. 2, 2005

(30) Foreign Application Priority Data

Nov. 28, 2003   (KR) .................... 10-2003-0085550

(51) Int. Cl.
*H01L 31/0232* (2006.01)
(52) U.S. Cl. .................... 257/432; 257/433; 257/434; 257/435; 257/436; 257/437

(58) Field of Classification Search ......... 257/431–437
See application file for complete search history.

(56) References Cited

U.S. PATENT DOCUMENTS

| 4,893,162 A | 1/1990 | Gentner et al. |
| 5,391,869 A | 2/1995 | Ade et al. |
| 6,049,638 A | 4/2000 | Norimatsu et al. |

*Primary Examiner*—Thien F. Tran
(74) *Attorney, Agent, or Firm*—Mayer, Brown, Rowe & Maw LLP (57) ABSTRACT

Provided is a light coupling apparatus that forms an etch structure complex comprising a total reflection surface/an anti-reflection surface within a substrate to improve coupling efficiency with incident light and responsivity of a photodetector device, whereby a surface-illuminated photodetector or an edge-coupled photodetector are all integratable, and it is possible to reduce the degree of difficulty during packaging and to improve the responsivity of the photodetector at low costs.

22 Claims, 5 Drawing Sheets

PHOTODETECTOR INTEGRATABLE LIGHT COUPLING APPARATUS

BACKGROUND

1. Field of the Invention

The present invention relates to a photodetector integratable light coupling apparatus and, more specifically, to a light coupling apparatus that forms an etch-structure complex comprising a total reflection surface/an anti-reflection surface within a substrate to improve coupling efficiency with an incident light and responsivity of a photodetector device.

2. Discussion of Related Art

Recently, there has been a need that a photodetector should have an ultra-high-speed operating characteristic from several tens of GHz to several hundreds of GHz and high responsivity characteristic due to a rapid increase in a quantity of data transmitted over wired/wireless communication, and a request for high definition of an image processing system.

Moreover, a small and thin light absorption layer has been used in the photodetector to accomplish the high-speed operating characteristics, which leads to reducing the efficiency/responsivity of the photodetector. Therefore, technology development is urgently needed that effectively connects the incident light from outside to the photodetector and increases the responsivity of the photodetector operating at the high speed.

For improving the coupling efficiency between an external light transmission apparatus and the photodetector, so far, a method of integrating a coupling apparatus, such as a refracting-facet photodetector, a waveguide photodetector, and a spot-size converter, and a method of making an optical path longer in the light absorption layer using the total reflection surface have been known. In addition, there is a resonant-cavity photodetector that forms a high reflection mirror above and below an active layer including the light absorption layer to enhance the light coupling efficiency and responsivity, which have a disadvantage that results in complexity and difficulty of an epi structure for stacking the mirror, an increase in costs, and limiting wavelength selectivity to a narrow bandwidth.

Meanwhile, exemplary embodiments of the prior arts in connection with the improvement of the light coupling efficiency using a sloping facet are disclosed in U.S. Pat. No. 4,893,162 to Gentner, etc. and U.S. Pat. No. 6,049,638 issued 2000 to Norimatsu, etc.

U.S. Pat. No. 4,893,162 to Gentner, etc. is directed to a waveguide structure that forms one or two non-absorptive waveguide, III–V compound semiconductor, to attempt an evanescent coupling or a coupling with the photodetector by reflection at an etch surface. The etch surface used herein is formed at the end of the waveguide so that light along the waveguide can be reflected to enter into the photodetector portion.

U.S. Pat. No. 6,049,638 to Norimatsu, etc. is directed to the improvement of the light coupling efficiency using a refraction at an interface, and relates to a structure that the incident light refracted at one etch surface is reflected on another etch surface to enter into the photodetector.

There is still a room for improvement in a method of coupling the waveguide and external light for the above invention to Gentner, etc., and a method of coupling the etch surface to be an incident surface with refraction facet and external light for the above invention to Norimatsu, etc.

Further, for the above inventions, a problem exists that a light coupling between the external light and the photodetector just depends on edge-coupled or bottom-side illumination, thus limiting an arranging method that can be selected upon packaging.

SUMMARY OF THE INVENTION

Accordingly, the present invention is contrived to substantially obviate one or more problems due to limitations and disadvantages of the related art. The present invention is directed to an etch-structure complex that can be integrated for use in an edge-coupled photodetector or a surface-illuminated photodetector.

According to the present invention, there is provided a light coupling apparatus including an etch-structure complex improving light coupling efficiency and responsivity with a combination of a total reflection surface/an anti-reflection surface.

In addition, the present invention provides a method of coupling between a waveguide and external light through new schemes.

Further, the present invention provide a structure that enables a coupling with a waveguide through incident light perpendicular to an epi-surface to facilitate a light arrangement, and a light coupling through a top-side illumination even in a structure requiring a bottom-side illumination.

One aspect of the present invention is to provide a photodetector integratable light coupling apparatus, comprising: a substrate having a photodetector mounted on a predetermined area thereof; and an etch structure complex formed in the substrate and having a total reflection surface that is total-reflection coated to have a first predetermined angle and an anti-reflection surface that is anti-reflection coated to have a second predetermined angle, wherein light incident from outside is reflected at the total reflection surface, and then the incident light is transmitted to and passed through the anti-reflection surface, and transmitted to the photodetector.

Here, the photodetector may be a surface-illuminated photodetector or an edge-coupled photodetector, and be any one of a planar/waveguide p-i-n photodetector, a resonant cavity/waveguide avalanche photodetector, a velocity matched distributed photodetector, a single/periodically-distributed unitravelling carrier photodetector, and a metal-semiconductor-metal photodetector.

In a preferred embodiment of the present invention, a waveguide is further formed between the photodetector and the anti-reflection surface, in case where the photodetector is an edge-coupled photodetector.

Further, the etch structure complex further comprises the total reflection surface and/or the anti-reflection surface to make the incident light detected through one or more photodetectors.

Another aspect of the present invention is to provide a photodetector integratable light coupling apparatus, comprising: a substrate having a surface-illuminated photodetector mounted on a predetermined area thereof; and an etch structure complex including: a first anti-reflection surface that passes through incident light entering into the substrate; a first total reflection surface coated so that the incident light may be totally reflected with a first predetermined angle and transmitted to the photodetector; and a second total reflection surface for transmitting the light, which is not absorbed into the photodetector and reflected back, to the photodetector, wherein the light incident from outside passes through the first anti-reflection surface and is reflected from the first total reflection surface to be transmitted and absorbed into the photodetector, and wherein the light, which is not absorbed into the photodetector and reflected, passes through the second total reflection surface and is absorbed again into the photodetector.

In a preferred embodiment of the present invention, one or more total reflection surfaces for transmitting the light that is not absorbed into the photodetector and reflected back, to the photodetector may be further comprised.

Here, the total reflection surface is coated by any one of a metal layer, such as Au and Ag, a single dielectric thin film, such as $SiO_x$, $SiN_x$, $CeO_2$, $CeF_3$, $SiO_2$, $TiO_2$, $MgF_2$ and ZnS, and a multiple-layer composed of a combination thereof. And, the anti-reflection surface is coated by any one of a single-layer, a double-layer and a multi-layer composed of a dielectric thin film, such as $SiO_x$, $SiN_x$, $CeO_2$, $CeF_3$, $SiO_2$, $TiO_2$, $MgF_2$ and ZnS.

Meanwhile, the substrate is an InP substrate, and the InP substrate in the etch structure complex is manufactured to have a sloping surface with a sloping angle according to a combination of an etching mask direction and an etching method using an HBr-based etchant or an HCl-based etchant.

Further, the etch structure complex is manufactured in the same epi-structure as the photodetector.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

An embodiment of the present invention will now be described with reference to the accompanying drawings. The present invention is not limited to those embodiments disclosed herein, but rather implemented in a variety of modification. The embodiment is provided to inform the scope of the present invention to those skilled in the art for thorough understanding.

Figure 1:
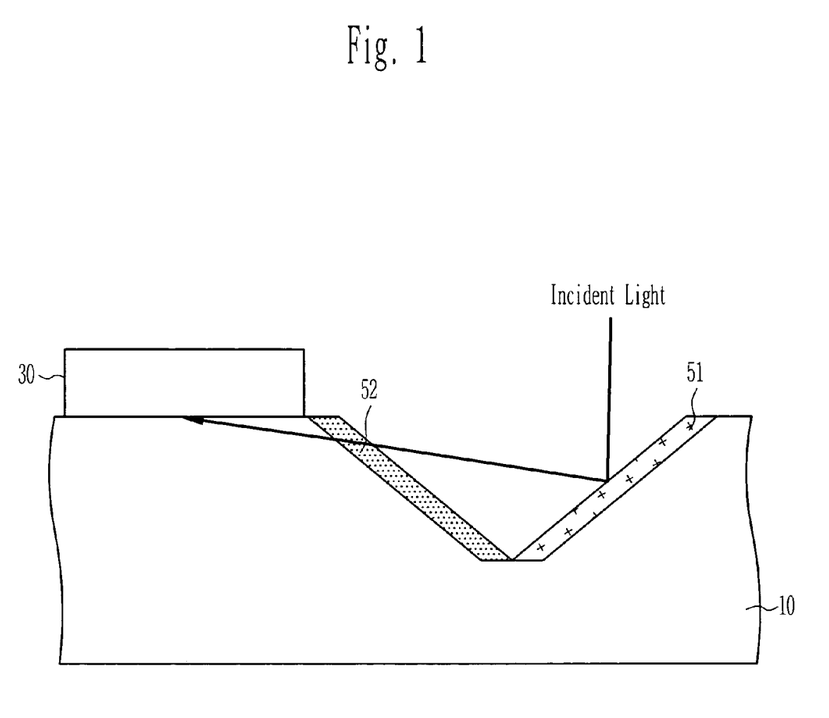
FIG. 1 is a cross-sectional view of a photodetector integratable light coupling apparatus according to a preferred embodiment of the present invention.

A photodetector integratable light coupling apparatus according to a preferred embodiment of the present invention is now described in detail with reference to FIG. 1.

The light coupling apparatus comprises a substrate 10 having a photodetector mounted on a predetermined area thereof; and an etch structure complex having a coated total reflection surface 51 and a coated anti-reflection surface 52 inside the substrate 10. The total reflection surface 51 reflects incident light, and the anti-reflection surface 52 receives the incident light reflected from the total reflection surface 51, passes it through, and transmits the incident light to the photodetector 30. The total reflection surface 51 can be configured such that it has a first sloping angle with reference to a lower surface of the substrate, and the anti-reflection surface 52 can be configured such that it has a second sloping angle with reference to the lower surface of the substrate.

Preferably, the total reflection surface 51 is coated with a surface having a total reflection (TR) property, and the anti-reflection surface 52 is coated with a surface having an anti-reflection (AR) property. These etch surfaces 51, 52 can be manufactured in a desired form using an appropriate etch mask and an appropriate etching method, such as dry etch or wet etch.

Meanwhile, when the incident light is entered into the total reflection surface of the light coupling apparatus to be almost totally reflected and transmitted to the photodetector 30 via the anti-reflection surface 52, the light passing through the anti-reflection surface 52 is refracted or passed straight, thus scarcely reflected, and is directly or indirectly transmitted to a light absorption layer of the photodetector 30.

The photodetector 30 is not limited to a specific one, and can be various ones including, for example, a surface-illuminated photodetector and an edge-coupled photodetector, specifically, a planar/waveguide p-i-n photodetector, a resonant cavity/waveguide avalanche photodetector (RC/WG-APD), a velocity matched distributed photodetector (VMDP), a single/periodically-distributed unitravelling carrier photodetector (s/p-UTC-PD), and a metal-semiconductor-metal photodetector (MSM-PD). Of course, one or more photodetectors 30 can be manufactured to be mounted at a predetermined portion on the substrate.

Meanwhile, with regard to an example of a material that can coat sloping surfaces, a metal layer such as Au and Ag, a single dielectric layer, such as $SiO_x$, $SiN_x$, $CeO_2$, $CeF_3$, $SiO_2$, $TiO_2$, $MgF_2$ and ZnS, and multiple layers constituted by a combination thereof can be deposited to implement the total reflection surface 51 that can have a total reflection or high reflection coating. The dielectric layer, such as $SiO_x$, $SiN_x$, $CeO_2$, $CeF_3$, $SiO_2$, $TiO_2$, $MgF_2$ and ZnS can be deposited in a single layer, double or multiple layers to implement the anti-reflection surface 52 that can have anti-reflection characteristic. The total reflection surface 51/the anti-reflection layer 52 can be selectively formed by a photolithography method. A coating thickness is determined by the refraction index of each material, a wavelength of the incident light, and incident angle, and for example, in case where the anti-reflection surface is formed of $SiO_2/TiO_2$, the coating thickness is approximately 2000 Å for vertical illumination of light having 1.55 µm wavelength.

As a method for forming the etch structure complex inside the substrate 10, an HBr-based etchant or an HCl-based etchant can be used in the case of an InP substrate. Here, sloping surfaces having various sloping angles can be manufactured according to a combination of an etching mask direction, a dry etching method and a wet etching method. The sloping angle (etch angle; $\theta_1$, $\theta_2$) can be changed according to the etchant and the arrangement direction of the etch mask. For example, in the case of the InP substrate of the mask direction [0 1 1], a sloping angle of 35° with the HCl-based etchant and an etch angle of 54.7° with the HBr-based etchant can be achieved, respectively. Using such sloping angles, the exemplary etch structure complex can be manufactured. FIGS. 2A to 2D are views showing examples of forming an etch structure complex according to a preferred embodiment of the present invention.

Figure 2A:
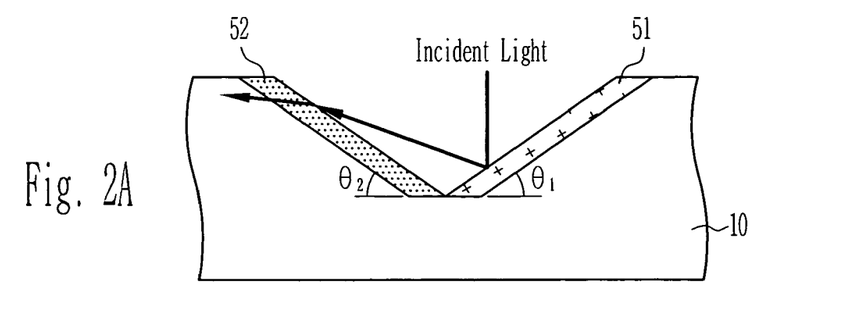
FIGS. 2A to 2D are views showing examples of forming an etch structure complex according to a preferred embodiment of the present invention.
Figure 2B:
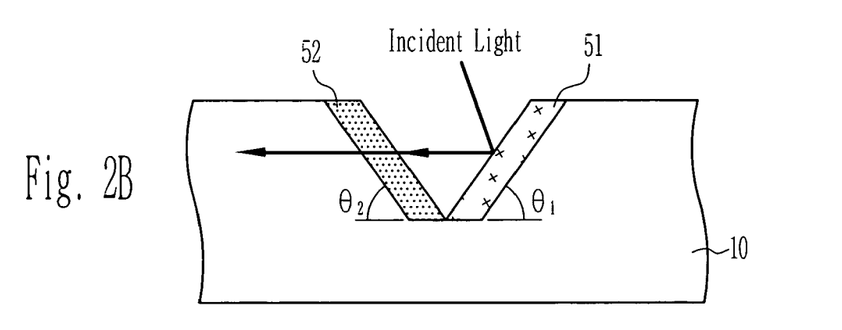
Figure 2C:
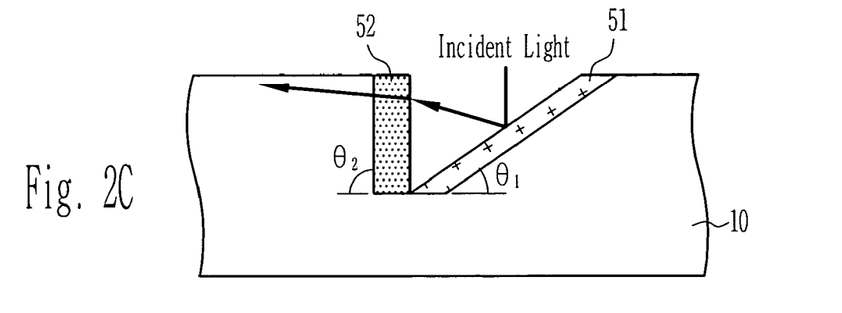
Figure 2D:
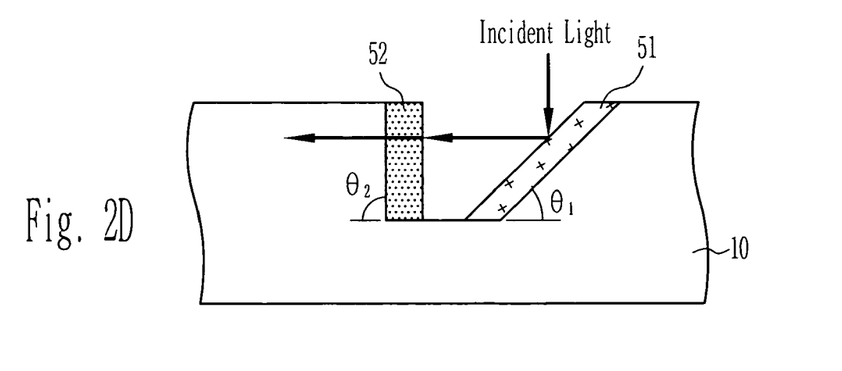

FIG. 2A shows an etch structure complex in case where a first sloping angle $\theta_1$ and a second sloping angle $\theta_2$ are all 35°, FIG. 2B shows an etch structure complex where the first sloping angle $01_1$ and the second sloping angle $\theta_2$ are all 54.7°, FIG. 2C shows an etch structure complex where the first sloping angle $\theta_1$ is 35° and the second sloping angle $\theta_2$ is 90°, and FIG. 2D shows an etch structure complex where the first sloping angle is 45° and the second sloping angle $\theta_2$ is 90°.

Figure 3:
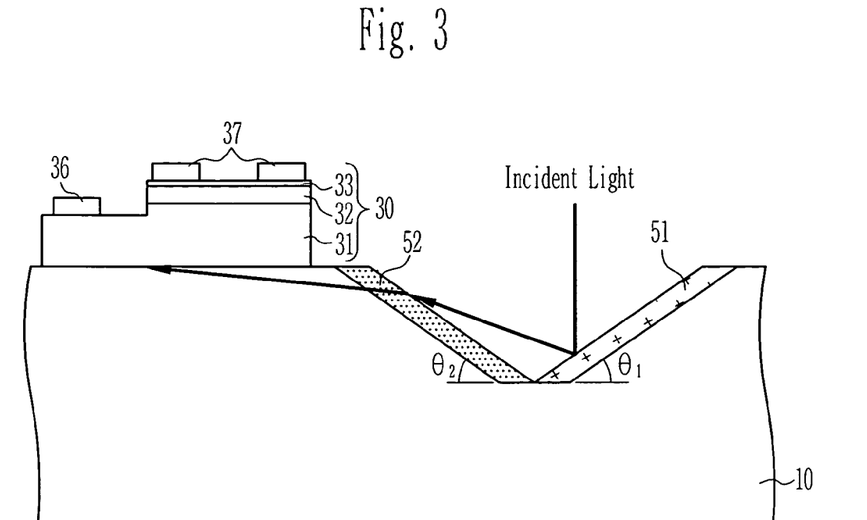
FIGS. 3 and 4 are cross-sectional views of a photodetector device integrating an etch structure complex with a surface-illuminated photodetector according to a preferred embodiment of the present invention.
Figure 4:
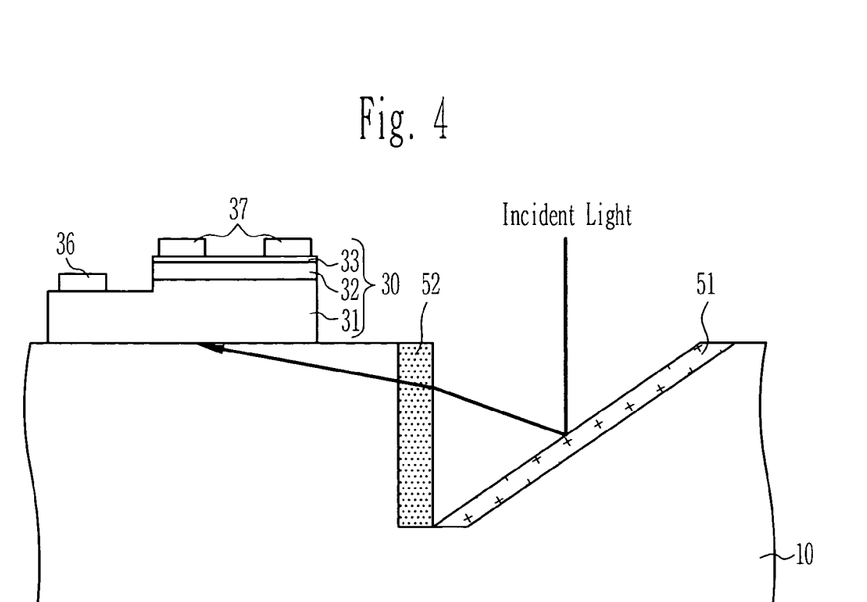

Next, various photodetectors integrated to a light coupling apparatus according to the preferred embodiment of the present invention are described in detail. FIGS. 3 and 4 are cross-sectional views of a light coupling apparatus where the etch structure complex in FIGS. 2A and 2C is integrated to a surface-illuminated photodetector, and FIGS. 5 and 6 are cross-sectional views of a light coupling apparatus where the etch structure complex in FIGS. 2B and 2D is integrated to an edge-coupled photodetector.

Referring to FIGS. 3 and 4, a surface-illuminated photodetector 30 in which a collector layer 31, a light absorption layer 32, and a p-contact layer 33 are grown on a semiconductor substrate 10 can be manufactured on the light coupling apparatus, in which the etch structure complex is formed through the known process, such as a formation of a p-electrode 37, a mesa-etching, a formation of an n-electrode 36, a formation of a passivation layer, a pad-coating, and etc. For example, the surface-illuminated photodetector is composed of a $p^+$-InGaAs p-contact layer 33, an InGaAs light absorption layer 32, an n-InAlAs collector layer 31 and a Ge/Au/Ni/Au n-electrode 36, and a Ti/Pt/Au p-electrode 37 on the p-contact layer 33.

For a real application, the photodetector can also be manufactured by growing a structure including a spacer layer, a charging layer, a multiplication layer, and a potential barrier layer according to a specific design, and in a mesa or planar structure as well. Further, the photodetector can be manufactured in a structure of a p-i-n photodetector, an avalanche photodetector, a unitravelling carrier photodetector (UTC-PD) and the like.

Figure 5:
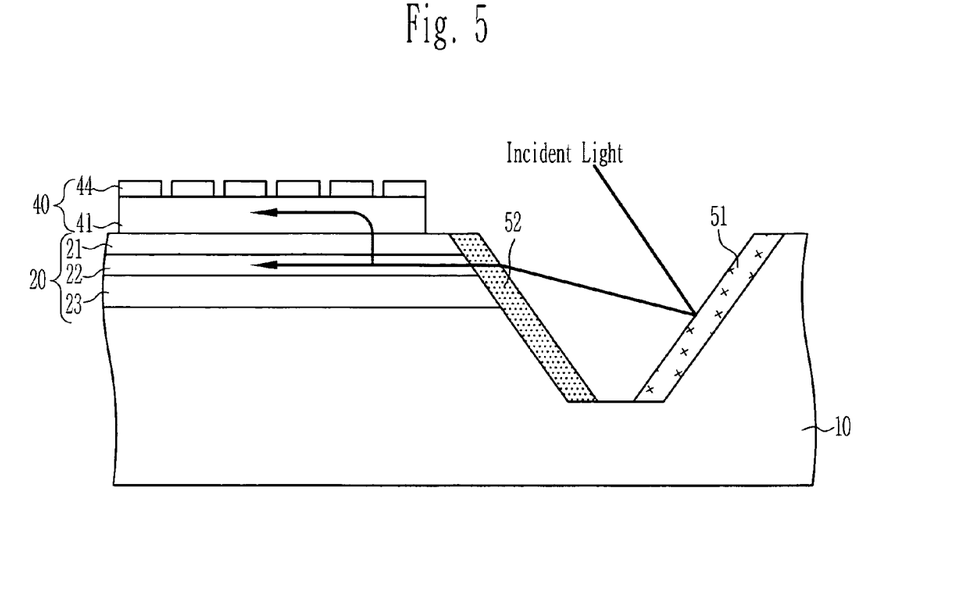
FIGS. 5 and 6 are cross-sectional views of a photodetector device integrating an etch structure complex with an edge-coupled photodetector according to a preferred embodiment of the present invention.
Figure 6:
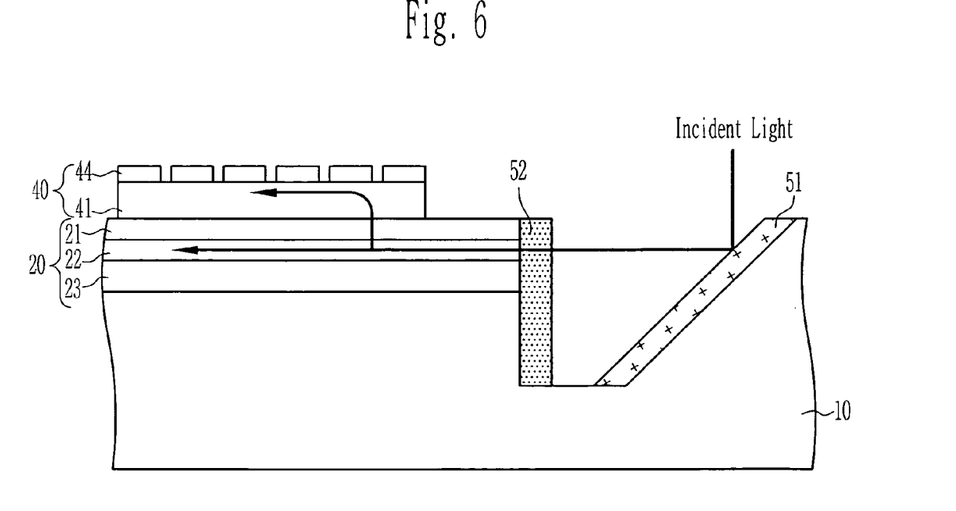

Referring to FIGS. 5 and 6, an edge-coupled photodetector 40 can be manufactured by sequentially growing a lower cladding 23, a core 22, an upper cladding 21, and a photodetector layer 41 on the substrate 10 and by forming an interdigitated (IDT) electrode 44 on the photodetector layer 41. A metal-semiconductor-metal (MSM) photodetector, for example, a GaAs MSM photodetector, can be manufactured by forming an $Al_{0.25}Ga_{0.75}As$ upper and lower claddings, an $Al_{0.21}Ga_{0.79}As$ core layer, a GaAs photodetector layer 41, and a Ti/Pt/Au IDT electrode 44.

Referring to FIG. 5, light incident through the etch structure complex including a sloping total reflection surface 51 and an anti-reflection surface 52 is coupled to the core 22 portion of a waveguide 20 to propagate, and then is evanescently coupled to the photodetector layer 41 to be absorbed into the MSM photodetector 40 having the IDT electrode 44. Besides the MSM photodetector, an edge-coupled photodetector can be manufactured with a waveguide p-i-n photodetector, a waveguide avalanche photodetector, a velocity matched distributed photodetector (VMDP), and a periodically distributed unitravelling carrier photodetector (p-UTC-PD).

Meanwhile, as shown in FIGS. 5 and 6, the anti-reflection surface 52 can be etched and anti-reflection coated by the etching method as described above after the waveguide 20 is formed.

FIG. 6 shows a structure in case where vertical incident light is totally reflected through the sloping total reflection surface 51, passes through the vertically formed anti-reflection surface 52 to be coupled to the waveguide 20, and evanescently coupled and detected at the photodetector.

For actual application of the present invention, it is also possible to implement the structure in such a manner that the incident light passes through the anti-reflection surface before entering into the total reflection surface, or if necessary, that the reflected incident light, which is not absorbed into the absorption layer of the photodetector, is entered back into the absorption layer. For example, it is to render the incident light re-absorbed into the absorption layer of the photodetector by appropriately arranging the total reflection surface. Such modification is illustrated in FIG. 7.

Figure 7:
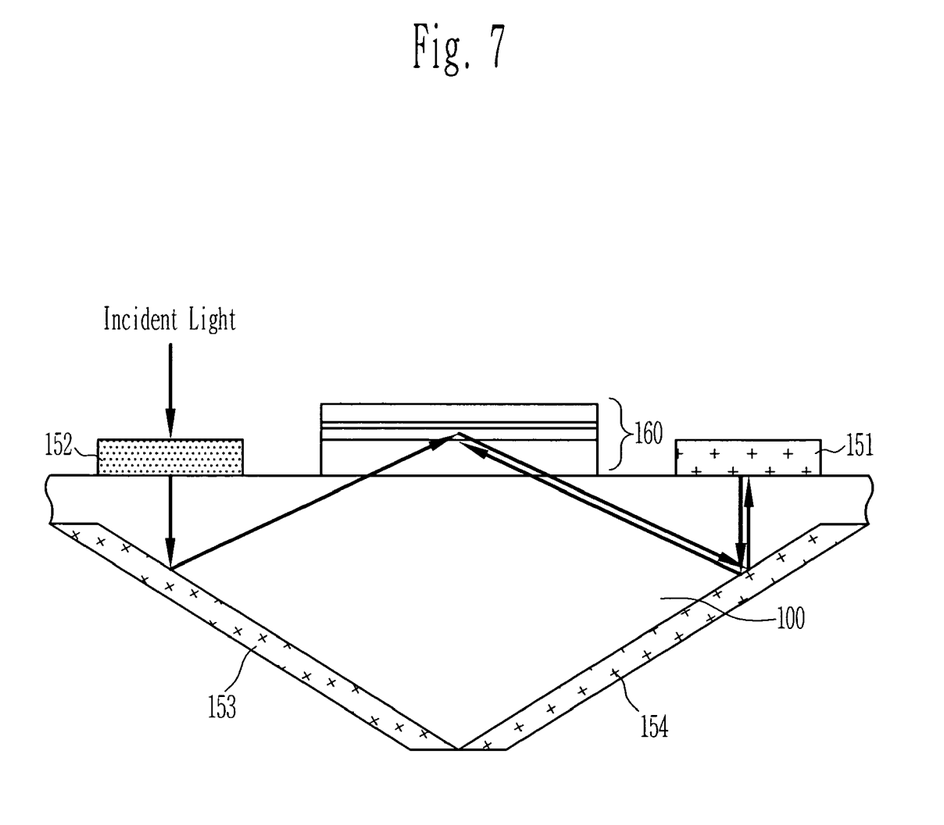
FIG. 7 is a cross-sectional view of a photodetector integratable light coupling apparatus according to another embodiment of the present invention.

FIG. 7 is a view showing a photodetector 160 integratable light coupling apparatus according to another embodiment of the present invention. The difference with the foregoing embodiments is that the light is illuminated to the surface-illuminated photodetector 160 with an etch structure complex comprising one anti-reflection surface 152 and three total reflection surfaces 151, 153, and 154, and is absorbed into the photodetector twice or more times, thereby enhancing the light coupling efficiency. That is, referring to FIG. 7, light incident through the first anti-reflection surface 152 parallel with the substrate 100 is totally reflected from the first total reflection surface 153 and is absorbed into the photodetector 160, and the light reflected from the photodetector 160 (reflected from the interface of an epi layer and a p-electrode, etc.) is reflected from the second total reflection surface 154, and then is reflected again from the third total reflection surface 151 parallel with the substrate and, the light returning to the second total reflection 154 is secondarily absorbed into the photodetector 160.

According to the embodiment of the present invention, at the etch structure complex, the re-growth process can be omitted by manufacturing it in the same epi-structure as the photodetector. Further, the etch structure complex is formed by selectively performing the total reflection coating or the anti-reflection coating on a desired etch surface.

The coupling with the waveguide through the incident light perpendicular to the epi surface is rendered to facilitate the optical arrangement, and the light coupling through the top-side illumination is enabled even in case that the bottom-side illumination is required, and the optical path can be redirected by using the combination of the total reflection surface/anti-reflection surface and the etch structure complex to enhance the responsivity.

According to the present invention as described above, a light coupling apparatus, which can be integrated with either a surface-illuminated photodetector or an edge-coupled photodetector, can be provided.

Further, light coupling efficiency and responsivity between the incident light and the photodetector can be enhanced by integrating the photodetector, which becomes smaller for ultra high-speed, to the light coupling apparatus according to the present invention.

Further, at the etch structure complex, the re-growth process can be omitted by manufacturing it in the same epi-structure as the photodetector.

Meanwhile, the coupling with the waveguide through the incident light perpendicular to the growth surface is enabled, thus facilitating the optical arrangement, and the light coupling can be made through the top-side illumination even in a structure requiring the bottom-side illumination, thereby avoiding the packaging method such as flip-chip bonding. As a result, it is possible to reduce the degree of difficulty during packaging and improve the responsivity of the photodetector at low costs.

While the subject matter of the present invention is specifically described according to the preferred embodiment, it should be noted that the above-mentioned embodiments are for illustrative only, rather than for a limiting sense. Further, those skilled in the art will appreciate that a variety of embodiments can be made without departing from the scope of the present invention.

What is claimed is:

1. A photodetector integratable light coupling apparatus, comprising:
   a substrate having a surface-illuminated photodetector mounted on a predetermined area thereof; and
   an etch structure complex including:
      a first anti-reflection surface that passes through incident light entering into the substrate;
      a first total reflection surface coated so that the incident light is totally reflected with a first predetermined angle and transmitted to the photodetector; and
      a second total reflection surface for reflecting the light which is not absorbed into the photodetector, back to the photodetector,
   wherein the light incident from outside passes through the first anti-reflection surface and is reflected from the first total reflection surface to be transmitted and absorbed into the photodetector, and
   wherein the light, which is not absorbed into the photodetector and reflected, is reflected from the second total reflection surface and is absorbed again into the photodetector.

2. The photodetector integratable light coupling apparatus according to claim 1, further comprising:
   one or more total reflection surfaces for reflecting the light which is not absorbed into the photodetector, back to the photodetector.

3. The photodetector integratable light coupling apparatus according to claim 1, wherein at least one of the first total reflection surface and the second the total reflection surface is coated by any one of a metal layer, selected from the group consisting of Au and Ag, a single dielectric thin film, selected from the group consisting of $SiO_x$, $SiN_x$, $CeO_2$, $CeF_3$, $SiO_2$, $TiO_2$, $MgF_2$ and ZnS, and a multiple-layer composed of a combination thereof.

4. The photodetector integratable light coupling apparatus according to claim 1, wherein the anti-reflection surface is coated by any one of a single-layer, a double-layer and a multi-layer composed of a dielectric thin film, selected from the group consisting of $SiO_x$, $SiN_x$, $CeO_2$, $CeF_3$, $SiO_2$, $TiO_2$, $MgF_2$ and ZnS.

5. The photodetector integratable light coupling apparatus according claim 1, wherein the etch structure complex is manufactured in the same epi-structure as the photodetector.

6. The photodetector integratable light coupling apparatus according claim 1, wherein the substrate is an InP substrate.

7. The photodetector integratable light coupling apparatus according to claim 6, wherein the InP substrate in the etch structure complex is manufactured to have a sloping surface with a sloping angle according to a combination of an etching mask direction and an etching method using an HBr-based etchant or an HCl-based etchant.

8. A photodetector integratable light coupling apparatus, comprising:
   a substrate having a surface-illuminated photodetector mounted on a predetermined area thereof; and
   an etch structure complex including:
      a first anti-reflection surface that passes through incident light entering into the substrate;
      a first total reflection surface coated so that the incident light is reflected with a first predetermined angle and transmitted to the photodetector;
      a second total reflection surface for reflecting the light which is not absorbed into the photodetector, back to the photodetector; and
      a third total reflection surface for reflecting the light which is not absorbed into the photodetector, back to the photodetector,
   wherein the light incident from outside passes through the first anti-reflection surface and is reflected from the first total reflection surface to be transmitted and absorbed into the photodetector, and
   wherein the light, which is not absorbed into the photodetector and reflected, is reflected from the second total reflection surface and is absorbed again into the photodetector.

9. The apparatus of claim 8, wherein the third total reflection surface is configured to reflect the light received from the second total reflection surface and reflect the light back to the second total reflection surface so that the light can be reflected back to the photodetector.

10. The apparatus of claim 8, wherein at least one of the first total reflection surface and the second total reflection surface is coated by any one of a metal layer, selected from the group consisting of Au and Ag, a single dielectric thin film, selected from the group consisting $SiO_x$, $SiN_x$, $CeO_2$, $CeF_3$, $SiO_2$, $TiO_2$, $MgF_2$ and ZnS, and a multiple-layer composed of a combination thereof.

11. The apparatus of claim 8, wherein the first total reflection surface and the second total reflection surface is coated by any one of a metal layer, selected from the group consisting Au and Ag, a single dielectric thin film, selected from the group consisting $SiO_x$, $SiN_x$, $CeO_2$, $CeF_3$, $SiO_2$, $TiO_2$, $MgF_2$ and ZnS, and a multiple-layer composed of a combination thereof.

12. The apparatus of claim 8, wherein the substrate is an InP substrate.

13. The apparatus of claim 8, wherein the etch structure complex is manufactured in the same epi-structure as the photodetector.

14. The apparatus of claim 8, wherein the anti-reflection surface is coated by any one of a single-layer, a double-layer and a multi-layer composed of a dielectric thin film, selected from the group consisting $SiO_x$, $SiN_x$, $CeO_2$, $CeF_3$, $SiO_2$, $TiO_2$, $MgF_2$ and ZnS.

15. The apparatus of claim 14, wherein the InP substrate in the etch structure complex is manufactured to have a sloping surface with a sloping angle according to a combination of an etching mask direction and an etching method using an HBr-based etchant or an HCl-based etchant.

16. A photodetector integratable light coupling apparatus, comprising:
   a substrate having a surface-illuminated photodetector mounted on a predetermined area thereof; and
   an etch structure complex including:
      a first anti-reflection surface that passes through incident light entering into the substrate;
      a first total reflection surface coated so that the incident light is reflected with a first predetermined angle and transmitted to the photodetector;

a second total reflection surface for reflecting the light which is not absorbed into the photodetector; and a third total reflection surface configured to receive the light reflected from the second total reflection surface and reflect the light back to the second total reflection surface so that the light can be reflected back to the photodetector, wherein the light incident from outside passes through the first anti-reflection surface and is reflected from the first total reflection surface to be transmitted and absorbed into the photodetector;

wherein the light, which is not absorbed into the photodetector and reflected, is reflected from the second total reflection surface and is absorbed again into the photodetector.

17. The apparatus of claim 16, wherein at least one of the first total reflection surface and the second total reflection surface is coated by any one of a metal layer, selected from the group consisting of Au and Ag, a single dielectric thin film, selected from the group of $SiO_x$, $SiN_x$, $CeO_2$, $CeF_3$, $SiO_2$, $TiO_2$, $MgF_2$ and ZnS, and a multiple-layer composed of a combination thereof.

18. The apparatus of claim 16, wherein the first total reflection surface and the second total reflection surface is coated by any one of a metal layer, selected from the group consisting Au and Ag, a single dielectric thin film, selected from the group consisting $SiO_x$, $SiN_x$, $CeO_2$, $GeE_3$, $SiO_2$, $TiO_2$, $MgF_2$ and ZnS, and a multiple-layer composed of a combination thereof.

19. The apparatus of claim 16, wherein the anti-reflection surface is coated by any one of a single-layer, a double-layer and a multi-layer composed of a dielectric thin film, selected from the group consisting $SiO_x$, $SiN_x$, $CeO_2$, $CeF_3$, $SiO_2$, $TiO_2$, $MgF_2$ and ZnS.

20. The apparatus of claim 16, wherein the etch structure complex is manufactured in the same epi-structure as the photodetector.

21. The apparatus of claim 16, wherein the substrate is an InP substrate.

22. The apparatus of claim 21, wherein the InP substrate in the etch structure complex is manufactured to have a sloping surface with a sloping angle according to a combination of an etching mask direction and an etching method using an HBr-based etchant or an HCl-based etchant.

* * * * *